United States Patent [19]
Mitanaga et al.

[11] Patent Number: 5,923,997
[45] Date of Patent: Jul. 13, 1999

[54] SEMICONDUCTOR DEVICE

[75] Inventors: Akiharu Mitanaga; Hisashi Ohtani; Satoshi Teramoto, all of Kanagawa, Japan

[73] Assignee: Semiconductor Energy Laboratory Co., Ltd., Kanagawa-ken, Japan

[21] Appl. No.: 08/877,306

[22] Filed: Jun. 17, 1997

Related U.S. Application Data

[62] Division of application No. 08/255,701, Jun. 7, 1994, Pat. No. 5,808,321.

[30] Foreign Application Priority Data

Jun. 12, 1993 [JP] Japan ................................. 5-166115

[51] Int. Cl.$^6$ .................................................. H01L 29/04
[52] U.S. Cl. .......................................... 438/486; 438/166
[58] Field of Search ..................................... 438/166, 486, 438/487, 308, 488, 528, 532, 183, 155, 201, 393; 148/DIG. 16; 117/7, 8, 9, 10

[56] References Cited

U.S. PATENT DOCUMENTS

| | | | |
|---|---|---|---|
| 4,068,020 | 1/1978 | Reuschel ................................. | 427/85 |
| 4,755,865 | 7/1988 | Wilson et al. ........................... | 357/63 |
| 4,868,014 | 9/1989 | Kanai et al. ............................ | 438/482 |
| 5,142,344 | 8/1992 | Yamazaki ............................... | 357/23.7 |
| 5,147,826 | 9/1992 | Liu et al. . | |
| 5,242,507 | 9/1993 | Iverson ................................... | 148/33 |
| 5,252,507 | 10/1993 | Iverson . | |
| 5,266,816 | 11/1993 | Seto et al. ............................... | 257/65 |
| 5,275,851 | 1/1994 | Fonash et al. . | |
| 5,278,093 | 1/1994 | Yonehara . | |
| 5,315,132 | 5/1994 | Yamazaki ............................... | 257/66 |
| 5,318,919 | 6/1994 | Noguchi et al. ........................ | 437/41 |
| 5,481,121 | 1/1996 | Zhang et al. ........................... | 257/64 |
| 5,485,019 | 1/1996 | Yamazaki et al. ..................... | 257/57 |
| 5,491,107 | 2/1996 | Turner .................................... | 437/162 |
| 5,531,182 | 7/1996 | Yonehara ................................ | 117/7 |

FOREIGN PATENT DOCUMENTS

| | | |
|---|---|---|
| 2-140915 | 1/1990 | Japan . |
| 2-140915 | 5/1990 | Japan . |
| 4-139728 | 5/1992 | Japan . |
| 2171844 | 9/1986 | United Kingdom . |

OTHER PUBLICATIONS

Cuane etal. Combined CW Laser and Furnace Annealing of Amorphous Si and Ge in Contact with Some Metals:, Appl. Surf. Sci. 36 597–604, 1989.
S. Caune et al. Appl. Surf. Sci. 36(1989)597 "Combined CW laser and furnace annealing of a–Si and Ge in contact with some metals", 1989.
F. Spaepen et al. in Crucial Issues in Semic. Mater. & Proc. Technol. (S. Coffa, ed.), p. 483, "Metal–enhanced growth of silicon", 1992.
S.F. Gong et al., J. Appl. Phys. 63(3)(1988)1457 "Initial . . . Sb and a–Si thin films", Aug. 1988.

(List continued on next page.)

*Primary Examiner*—Charles Bowers
*Assistant Examiner*—Martin Sulsky
*Attorney, Agent, or Firm*—Sixbey, Friedman, Leedom & Ferguson, P.C.; Gerald J. Ferguson, Jr.; Eric J. Robinson

[57] ABSTRACT

One kind or plural kinds of elements selected from a groups III, IV or V elements are introduced in an amorphous silicon film, and then crystallized by heating at 600° C. or less. The crystallization develops from a region where the element has been introduced in a direction parallel to a substrate. An active region of a semiconductor device is formed in a portion of the crystallized semiconductor layer in such a manner that the relation between the crystal growth direction and the direction in which the electric current of the device is selected in accordance with a desired mobility of the active region.

21 Claims, 5 Drawing Sheets

OTHER PUBLICATIONS

A.E. Robertson et al., J.Vac. Sci. Technol., A5(4)(1987)1447 "Metal induced crystallization of a–Si", Jul. 1987.

R.J. Nemanich et al., J. Vac. Sci. Technol. A3(3)(1985)938 "Initial reactions and silicide formation of Ti on Si . . . ", May 1985.

C. Hayzelden et al., Appl. Phys. lett. 60(2)(1992)225 "In situ TEM studies of silicide mediated crytallization of a–Si", Jan. 1992.

Hayzelden et al., "In situ transmission electron microscopy studies of silicide–mediated crystallization of amorphous silicon", Applied Physics Letters 60 (2), Jan. 13, 1992, pp. 225–227.

C. Hayzelden et al., "In Situ Transmission Electron Microscopy Studies of Silicide–Mediated Crystallization of Amorphous Silicon", Appl. Phys. Lett. 60(2)(1992) 225.

A.V. Dvurechenskii et al., "Transport Phenomena in Amorphous Silicon Doped by Ion Implantation of 3d Metals", Phys. Stat. Sol. A95(1986)635. No month.

T. Hempel et al., "Needle–Like Crystallization of Ni–Doped Amorphous Silicon Thin Films", *Solid State Communications*, vol. 85, No. 11, pp. 921–924, 1993. No month.

"Crystallized Si Films By Low–Temperature Rapid Thermal Annealing of Amorphous Silicon", R.Kakkad, J. Smith, W.S. Lau, S.J. Fonash, J. Appl. Phys. 65(5), Mar. 1, 1989, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62(20), May, 17, 1993, pp. 2554–2556.

"Selective Area Crystallization of Amorphous Silicon Films by Low–Temperature Rapid Thermal Annealing", Gang Liu and S.J. Fonash, Appl. Phys. Lett. 55(7), Aug. 14, 1989, pp. 660–662.

"Low Temperature Selective Crystallization of Amorphous Silicon", R. Kakkad, G. Liu, S.J. Fonash, Journal of Non––Crystalline Solids, vol. 115, (1989), pp. 66–68. No month.

SEMICONDUCTOR DEVICE

This is a Divisional application of Ser. No. 08/255,701, filed Jun. 7, 1994 now U.S. Pat. No. 5,808,321.

BACKGROUND OF THE INVENTION

1. Field of the Invention

The present invention relates to a semiconductor device having a TFT (thin film transistor) provided on an insulating substrate such as glass, and a method of manufacturing the semiconductor device.

2. Discussion of the Related Art

As the semiconductor having the TFT formed on the insulating substrate made of glass or the like, there have been known an active liquid crystal display device, an image sensor and the like, which use the TFT for driving a pixel.

A thin film silicon semiconductor is generally used for the TFT used in these devices. The thin film silicon semiconductor is roughly classified into the amorphous silicon semiconductor (a-Si) type and the crystalline silicon semiconductor type. The amorphous silicon semiconductor is most generally used because the manufacturing temperature is low, it can be relatively readily manufactured by a vapor phase method, and the mass productivity is sufficient. However, since the physical properties of the amorphous silicon semiconductor is inferior to the crystalline silicon semiconductor such as the electrical conductivity or the like, there is a strong demand to establish a method for manufacturing the TFT formed of the crystalline silicon semiconductor for the purpose of obtaining the higher speed characteristics in the future. As the crystalline silicon semiconductor, there have been known non-single crystalline silicon semiconductors such as polycrystalline silicon, microcrystalline silicon, amorphous silicon containing crystal components, semi-amorphous silicon having an intermediate state between the crystal property and the amorphous property, and the like. Hereinafter, the non-single crystalline silicon semiconductors having these crystal properties are called a crystalline silicon.

As a method of obtaining the thin film silicon semiconductors with these crystal properties, there have been known the following methods.

(1) A crystalline film is directly formed at the time of film formation.

(2) The energy of a laser illumination is applied to an amorphous semiconductor film which has been previously formed to provide the crystal property.

(3) A heat energy is applied to an amorphous semiconductor film which has been previously formed to provide the crystal property.

However, in the method (1), it is technically difficult to uniformly form a film having the excellent semiconductor physical properties all over the upper surface of a substrate. Further, since the film forming temperature is high, that is, 600° C. or more, there rises such a problem in costs that an inexpensive glass substrate cannot be used. In the method (2), in the case of an example of an excimer laser which is most generally used now, there rises a problem that a through-put is low because a laser beam radiated area is small. Furthermore, the stability of the laser beam is insufficient to uniformly treat the entire upper surface of a large-area substrate, whereby it strongly seems as if this method is the technique for the coming generation. In the method (3), there is advantageous in that this method can cope with the large-area of the substrate in comparison with the methods (1) and (2). However, a high temperature of 600° C. or more is required as a heating temperature, and taking the inexpensive glass substrate used into consideration, it is necessary to further decrease the heating temperature. In particular, the current liquid-crystal display unit advances to a large screen, and for that reason, it is necessary to use a large-scale glass substrate likewise. When such a large-scale glass substrate is used, there rises a serious problem that the contraction or strain of the substrate in the heating process essential to the semiconductor manufacture makes the accuracy in mask matching or the like deteriorate. In particular, in the case of the 7059 glass which is most generally used now, the temperature of the strain point is 593° C., whereby the conventional heat crystallization method causes the substrate to be largely deformed. Moreover, in addition to the temperature problem, since the current process requires heating time of several tens hour or more necessary for crystallization, it is also necessary to shorten the heating time.

SUMMARY OF THE INVENTION

The present invention has been made to eliminate the above-mentioned problems, and an object of the invention is to provide a process of lowering a temperature necessary for crystallization and reducing a time therefor in a method of manufacturing a thin film formed of a crystalline silicon semiconductor by application of a method of crystallizing a thin film formed of an amorphous silicon by heating. The crystalline silicon semiconductor prepared by a process of the present invention has the physical properties not lower than those prepared by the conventional process, and applicable even to the active layer region of a TFT.

The inventors have conducted the following experiments in the above-mentioned method of forming an amorphous silicon semiconductor film by the CVD method or the sputtering method to crystallize the film thus formed by heating, and considered the experiment result.

First, the mechanism of forming the amorphous silicon film on a glass substrate to crystalize the film by heating has been investigated. As a result, it has been observed that the crystal growth started from an interface between the glass substrate and the amorphous silicon, then developed into the columnar shape perpendicular to the front surface of the substrate when it has the thickness of a certain degree.

It is considered that the above-mentioned phenomenon is caused by the fact that a crystalline nucleus forming a base of the crystal growth (the source forming a base of the crystal growth) exists in the interface between the glass substrate and the amorphous silicon film and the crystal grows from the nucleus. Such a crystalline nucleus is considered to be of a bit of impure metallic element which exists on the surface of the substrate or the crystalline component of the glass surface (it is considered that the crystalline component of silicon oxide exists on the surface of the glass substrate as called the crystallized glass).

Therefore, it was considered that the temperature of crystallization can be lowered by more positively introducing the crystalline nucleus, and for the purpose of confirming the effect, a bit of other metals was formed on the substrate, and a thin film of the amorphous silicon was then formed thereon. Thereafter, the experiment of crystallization by heating was conducted. As a result, it was confirmed that, in the case of forming several metals on the substrate, the temperature of crystallization was lowered, and it was expected that there occurred crystal growth which had the foreign matter as the crystalline nucleus. Therefore, the mechanism of a plurality of impurity metals which could lower the temperature has been investigated in more detail.

The crystallization can be classified into two stages, that is, an initial nucleus production and the crystal growth from the nucleus. The speed of the initial nucleus production was observed by measuring a time until fine crystals occurred in the dot pattern at a given temperature. That time was reduced in any cases of the thin films forming the above impurity metals, and the effect of lowering the temperature of crystallization when the crystalline nucleus was introduced was confirmed. Further, the growth of a crystal particle after nucleus production was investigated while changing the heating time. As a result, though this was beyond all expectations, it was observed that even the speed of crystal growth after the nucleus production was remarkably increased in the crystallization of the amorphous silicon thin film formed on the film of a certain metal. This is beyond all expectations. This mechanism will be described in more detail later.

In any case, it was ascertained that, in the case of forming a thin film made of amorphous silicon on a film containing a bit of metal of a certain kind and thereafter crystallizing it by heating with the above-mentioned two effects, the sufficient crystal properties, which could not be conventionally expected, could be obtained at a temperature of 580° C. or less and for about four hours.

As examples of the impurity metals having such effects, there are indium, tin, antimony, germanium, thallium, lead, bismuth, and zinc. These impurity metals are close to silicon in group or period, and cooperate with silicon to readily produce a compound. Also they are commonly materials of a relatively low melting point, and hereinafter they are referred to as "low melting point material" in the specification. Also, there are Lanthanide series elements having the effect of lowering a temperature as the result of an experiment except for those elements. They are used as a hydrogen occlusion alloy and commonly highly reactive to hydrogen. In this specification, they are referred to as "catalytic metal". Further, according to the knowledge of the inventors, materials having the above-mentioned materiality among III, IV and V group elements can be used as the above-mentioned catalytic metal in principle. That is, there can be used B, Al, Ga, In, Tl, Sc, Y and Lanthanide of Group III elements, C, Ge, Sn, Pb, Ti, Zr, and Hf of group IV elements, and N, P, As, Sb, Bi, V, Nb and Ta of group V elements. Preferably, the above-mentioned indium (In), tin (Sn), antimony (Sb), germanium (Ge), thallium (Tl), lead (Pb), bismuth (Bi) and zinc (Zn) are useful to remarkably obtain the effect. Also, although zinc belongs to group II elements, it can be used as the above-mentioned low melting point metal because of a low melting point.

An example of how tin typical as the low melting point metal material provides the effect will be described. In the case where a thin film made of amorphous silicon formed by the plasma CVD method on a substrate (Corning 7059) which was not subjected to any processing, that is, on which a thin film made of a small amount of tin was not formed, was crystallized by heating in a nitrogen atmosphere, if a heating temperature was 600° C., 10 hours or more were required as a heating time. However, in the case of using a thin film made of amorphous silicon formed on a substrate on which a thin film made of a small amount of tin has been formed, the same crystallizing state could be obtained by heating for about one hour. At this time, the judgement of crystallization was made by using the Raman spectroscopic spectrum. As is apparent only from this fact, the effect of tin is very large.

As is understood from the above description, in the case where a thin film made of amorphous silicon is formed on a thin film made of a small amount of low melting point metal or a small amount of catalytic metal on the substrate, it is possible to reduce a time and temperature required for crystallization. On the assumption that this process is used for manufacturing the TFT, description will be given in more details. Although it will be described later, even if the thin film of the low melting point metal was formed on the amorphous silicon, the same effect could be obtained instead of forming the amorphous silicon on the metal, and also it was the same as in the case of ion implantation. Therefore, hereinafter, in this specification, a chain of these processes are referred to as "a small amount of low melting point metal addition" and "a small amount of catalytic metal addition". These metals may be added when forming the thin film made of amorphous silicon.

First, a method of adding the low melting point metal will be described. It is identified that the addition of a small amount of a low melting point metal may be made by a method of forming a thin film made of the small amount of low melting point metal on a substrate and then forming a film made of amorphous silicon thereon, or by forming the film of amorphous silicon in advance and then forming the thin film of the small amount of low melting point metal thereon, because both the methods have the temperature lowering effect likewise, and the film forming methods can be made by the sputtering method or the vapor deposition method so as not to be limited to a specific method. However, when the thin film made of a small amount of low melting point metal film on a substrate, it is remarkable in effect to form the thin film of silicon oxide on the substrate and then to form the thin film of a small amount of low melting point metal rather than to form the thin film of a small amount of low melting point metal directly on a substrate made of the 7059 glass. The reason for the above can be considered that it is significant for the crystallization at a low temperature in this case to bring silicon in direct contact with the low melting point metal, and in the case of the 7059 glass, the components except for silicon impede the contact or reaction of both the silicon and the low melting point metal. The entirely same adding method can be also applied to the catalytic metal.

As the method of adding a small amount of material, even in the case of adding a small amount of material by ion implantation in place of forming the thin film in contact with the upper or lower portion of amorphous silicon, the substantially same effect was confirmed. As the amount of the low melting point metal, for example, when the amount of adding tin is $1 \times 10^{15}$ atoms/cm$^3$ or more, the temperature lowering was confirmed. However, when the adding amount is $1 \times 10^{21}$ atoms/cm$^3$ or more, the shape of a peak of the Raman spectroscopic spectrum is clearly different from that of silicon simple substance. Therefore, it appears that the actual useable adding amount ranges from $1 \times 10^{15}$ atoms/cm$^3$ to $5 \times 10^{19}$ atoms/cm$^3$. It is also necessary to restrain the adding amount to $1 \times 10^{15}$ atoms/cm$^3$ to $1 \times 10^{19}$ atoms/cm$^3$ in view of the fact that it is used for the active layer of the TFT as a semiconductor materiality.

Subsequently, the crystallization mechanism supposed when adding a small amount of low melting point metal will be first described.

As mentioned above, in the case of adding no catalytic metal for low temperature crystallization, nucleuses occur from crystalline nucleuses such as the interface of a substrate or the like at random, and crystals grow from the nucleuses likewise at random. It was reported that there was obtained a crystal relatively oriented at (110) or (111) depending on the manufacturing method, and it was observed that the crystal grows substantially uniformly over the entire thin film.

For the purpose of confirming this mechanism, analysis was made by a DSC (differential scanning calorimeter). An amorphous silicon thin film formed on a substrate by the plasma CVD method was located in a sample vessel in such a condition where it is mounted on the substrate, and then a temperature in the vessel went up at a given speed. As a result, a definite heating peak was observed at around 700° C., and crystallization was also observed. This temperature is naturally shifted as the temperature rising speed is varied. For example, when the speed was 10° C./min, crystallization started at the temperature of 700.9° C. Subsequently, the measurements were made at three different temperature rising speeds, respectively, and then the activation energy of crystal growth after an initial nucleus was generated was obtained by the Ozawa method. Consequently, a value of approximately 3.04 eV was obtained. As the result that a reaction rate equation was obtained from fitting for a theoretical curve, it was proved that the crystallization mechanism is best explained by a disordered nucleus generation and its growth model, and there was confirmed the propriety of such a model that the nucleuses are produced from the crystalline nucleuses such as the interface of a substrate, etc. at random, and crystals grow from the nucleuses.

The entirely same measurement as in the above description was made to a case of adding the low melting point metal, in this example, of adding a small amount of tin. As a result, when a temperature went up at the speed of 10° C./min, crystallization started at 625.5° C., and the activation energy of the crystalline growth obtained from a chain of these measurements was 2.3 eV. Thus, it was numerically apparent that the crystalline growth was facilitated.

The reason why the crystallization starting temperature is made low is relatively readily considered as the result of the effect of foreign matters as described above. However, what is the cause of the temperature to be lowered up to the activation energy of the crystallization growth? As this cause, the inventors consider the following reasons.

A The rate-determining process in crystallization of amorphous silicon is generally said to be a self-diffusion of silicon atoms. If it is a fact, then it is better to make the diffusion speed higher. However, in the case of crystallization from amorphous silicon, it should be considered as crystallization from an undiluted solution having a very high viscosity, which is different from crystallization of a crystal from aqueous solution or the like. Therefore, since a difference in density between a crystalline portion and its periphery is very small, atoms cannot be readily moved. In such circumstances, in order to give atoms mobility, there are considered the following three methods.

1. The viscosity of an amorphous film is changed to provide circumstances in which silicon atoms are liable to move.

2. A large amount of defects, depletions or the like are introduced to provide circumstances in which silicon atoms are liable to move.

3. The Coulomb's force or the like is exerted to change the drive force of crystallization.

These three methods are not independent of each other, but it is considered that two or three of these methods are simultaneously satisfied depending upon the kind of material to be added.

The low melting point metal materials added in this case are considered to almost satisfy the above method 1. Also, as to III and V group materials, it is expected that positive or negative depletions or the like are formed in order to satisfy the principle of electrical neutrality, and therefore it is considered to satisfy the above method 2. Likewise, III and V group materials make the Fermi level shifted by generation of a level caused by these materials, and in the case where the amount of shift is different between an amorphous portion and a crystal portion (in general, it is considered that the amount of shift is differentiated by influence of the level of a middle gap in the amorphous portion), it is considered that the drive force caused by the difference in the amount of shift is generated, thereby enabling the temperature of crystallization to be lowered. As a result of supporting this mechanism, there is the fact that the temperature is difficult to be lowered in the case where III and V group materials are simultaneously added.

Subsequently, the crystallization mechanism in the case of adding a catalytic metal will be described.

Similarly in this case, as a result of measuring the activation energy of a crystal growth by a DSC measurement, it was identified that the energy was lowered to approximately 2.1 eV, and crystallization was facilitated. The following mechanisms are considered as this reason.

As mentioned above, these "catalytic metals" have a very high reactivity to hydrogen. Therefore, it is expected that the catalytic metals are coupled with hydrogen coupled with silicon in priority with the result that a large amount of dangling bonds are generated. The large amount of dangling bonds are considered to satisfy the above-mentioned method 2 for giving the atoms mobility. Also, it is considered that the generation of depletions or the like is caused by the difference in electro-negativity between silicon and Lanthanide to satisfy the principle of the electrical neutrality. Even though it is not such a case, it is required that Lanthanide is electrically greatly charged. In such a case, it is assumed that there is a possibility that the drive force is generated with the movement of the Fermi level.

Next, the crystal forms of crystalline silicon films obtained by adding a small amount of the above-mentioned low melting point metal or catalytic metal will be described. Since both of cases exhibited almost the same crystalline configuration, it seems that they are caused by the liability to movement of silicon atoms.

The metals added (both of the low melting point metals and the catalytic metals) diffuse to a considerably broad region at a temperature of the crystallization temperature or less. This fact was identified by a SIMS (secondary ion mass spectrometry). Then, as a result, even in the diffused region, the temperature of crystallization was lowered. Also, it was proved that the crystal form in the direct adding region is different from that in the peripheral region. That is, it was identified that, in the direct adding region, the crystal grows in a direction perpendicular to a substrate, whereas in the diffused region in the periphery thereof, the crystal grows in a direction horizontal to the substrate. It is assumed that they are caused by the differences in the initial nucleus generation of the crystal. That is, it is understood that, in the direct adding portion, these foreign matter comes into the crystal nucleus from which a crystal grows in the form of a column, whereas in the peripheral diffused region, the crystal nucleus is the direct adding portion growing in the longitudinal direction as mentioned above, and the lateral growth necessarily occurs because the growth starts from the crystal nucleus. Hereinafter, in this specification, the crystal growth region in the lateral direction extending from the direct adding region of the catalytic metal for low temperature crystallization to the periphery thereof is referred to as "lateral growth" region.

Subsequently, the electric characteristics of the small-amount addition portion and the lateral growth portion in the vicinity thereof will be described in the case of using the above-mentioned metals, in this example, indium which belongs to the low melting point metal. As to the electric characteristics of the small-mount addition portion, the electrical conductivity is the same value as that of a film to which the metal has not been added, that is, a film obtained by crystallization at about 600° C. for several ten hours. Also, as a result of obtaining the activation energy from the temperature dependency of the electrical conductivity, in the case where the amount of adding tin is $10^{17}$ atoms/cm$^3$ to $10^{18}$ atoms/cm$^3$ likewise as described above, no behavior caused by the level of indium (In) was observed. That is, it is considered from this experiment, that the crystalline silicon film can be used as the active layer of the TFT or the like if it has the above-mentioned density.

On the contrary, the electrical conductivity of the lateral growth portion is higher than that of the direct small-amount addition portion by one figure or more, which is a remarkably high value as a silicon semiconductor having crystallization. This is considered to be caused by the fact that a grain boundary existing in a space through which electrons pass between electrodes is reduced or hardly exist because the path direction of electric current coincides with the lateral growth direction of the crystal. This fact coincides with the result of a transmission electron beam microscopy photograph with no inconsistency. That is, it can be considered that since carriers moves along the grain boundary of the crystal which grew in the form of a needle or a column, the state where the carriers are liable to move is realized. The density of In in the region of the lateral growth was 1/10 of that in the region where In was directly added. This is useful in further utilizing the crystalline silicon film without influence of In.

Now, finally, taking the above-mentioned various characteristics into consideration, a method of application of the metal to the TFT will be described. An active matrix type liquid crystal display unit using the TFT for driving pixels is supposed as the field of the TFT application.

As mentioned above, in the recent large-screen active matrix type liquid crystal display unit, it is important to restrain the contraction of a glass substrate. Using a process of adding a small amount of metal catalyst for crystallization at a low temperature, crystallization can be made at a satisfactorily low temperature in comparison with the strain point of glass, which is particularly preferable. According to the present invention, a portion which has been conventionally made of amorphous silicon is crystallized for about four hours at 500 to 550° C. after adding a small amount of the low melting point metal or the catalytic metal whereby the portion can be readily replaced by crystalline silicon. Naturally, it is necessary to modify a design rule or the like correspondingly. However, it is considered that both of the conventional device and process can be sufficiently available, resulting in great advantages.

Furthermore, according to the invention, the TFT used for pixels and the TFT forming a driver for the peripheral circuit can be separately manufactured by utilizing the crystal form depending upon the respective characteristics, and there are many advantages more particularly in application of the invention to the active type liquid crystal display unit. The TFT used for the pixels does not require the mobility so much, and rather has a great advantage to reduce an OFF-state current.

For the above reason, a small amount of the low melting point metal or catalytic metal is added to a region which should come into the TFT used for the pixel so that a crystal grows in the lateral direction, as a result of which a large number of grain boundaries can be formed in the channel direction thereby to lower the OFF-state current. On the contrary, the TFT forming a driver for the peripheral circuit requires a very high mobility in view of the application of the TFT to a workstation, etc. Therefore, in the case of applying the present invention, a small amount of low melting metal or catalytic metal is added in the region close to the TFT forming the driver for the peripheral circuit, and a crystal is allowed to grow in one direction from the metal added portion. The direction of the crystal growth coincides with the path direction of electric current in the channel, thereby manufacturing the TFT having a very high mobility.

For reference, shown in FIG. 4 is an example where the Ni density after crystallization was investigated by SIMS in an example of obtaining a crystalline silicon film using Ni as the catalytic metal. It is apparent from FIG. 4 that the Ni density in the portion (lateral growth) where a crystal grew in a direction parallel to a substrate is lower than that in the region where Ni was directly added (plasma treated). Also, the data labeled with "a-Si" is the one to which no Ni is added, and the value is to be understood as a background. Similarly, in the present invention, it is considered that data having the fundamentally same tendency as that of FIG. 4 can be obtained. Therefore, it is considered that it is useful to utilize the region where the crystals grew in the direction parallel to the substrate.

If a silicon film crystallization is conducted by using a group III element, since the group III element remains in the film after the crystallization, a crystalline silicon film having a P-type conductivity can be obtained. Similarly, if the same is operated by using a group V element, a crystalline silicon film having n-type of conductive type can be obtained. The conductivity of the above crystalline silicon film with one conductive type can be controlled by the amount of group II and IV elements added when introduced at crystallization. Moreover, a conductivity type and a conductivity can be controlled by adding foreign matters that provide one conductivity type.

Further, for example, in the case where In which is a group III element is selectively introduced in the region 100 (FIG. 1A), and thereafter amorphous silicon film 104 is formed thereon so that crystallization is made by heating at 550° C. for four hours, a crystal growth is made from the region 100 in a direction parallel to a substrate. At this time, since In is diffused as the crystal grows, the indium element exists in the region where the crystallization has occurred. Since the density is about $2\times10^{17}$ to $2\times10^{19}$ atoms/cm$^3$, the region is crystallized and also made p-type. The p$^+$ region or p$^-$ region can be obtained by selecting the diffused region according to the amount of introducing In or crystallization. Then, TFT is formed by use of this region so whereby TFT having the channel forming region of p$^+$ type or p$^-$ type can be obtained. Likewise, in the case of using Sb which is a group V element instead of the above-mentioned In, the TFT having the channel forming region of n$^+$ type or n$^-$ type can be obtained. Thus, a threshold voltage of the TFT can be controlled by setting the conductive type of the channel forming region to p$^-$ type or the n−.

In the present invention, a trace amount of low melting point metal or catalytic metal as mentioned above is used for promoting a crystallization of a silicon semiconductor. The crystallization proceeds from the region where the metal has been added in one dimensional manner in a direction parallel with a substrate. The present invention is characterized by the use of such crystallized region for an electronic device.

More particularly, when an insulated gate field effect transistor is formed by use of a crystalline thin film silicon semiconductor of this region, a direction of moving carriers substantially coincide with a direction in which the crystals of a silicon film grow in its channel forming region, thereby being capable of obtaining a TFT having a high mobility. Further, the use of a crystalline silicon film whose crystals grew in a direction parallel to the substrate is useful in subjecting a diode and a transistor to integration for formation. Still further, a capacitor, a resistor and the like can be subjected to integration on the same substrate. Furthermore, they can be constituted by using an inexpensive glass substrate, which is another feature of the invention.

In the semiconductor using the thin film silicon semiconductor, the crystal growth direction of the crystalline silicon film whose crystals grew in the form of a needle or a column in the direction of a film plane substantially coincide with the direction of moving the carriers so that the carriers can move along the crystal grain boundary, thereby being capable of moving the carriers at a high mobility.

BRIEF DESCRIPTION OF THE DRAWINGS

The accompanying drawings, which are incorporated in and constitute a part of this specification, illustrate embodiments of the invention, and together with the description, serve to explain the objects, advantages and principles of the invention. In the drawings.

DETAILED DESCRIPTION OF THE PREFERRED EMBODIMENTS

Embodiments of the present invention will be described with reference to the accompanying drawings.

In the embodiments stated below, there are shown examples in which In of a group III element, Sb of a group V element and Sn of a group IV element are added by a small amount to crystallize a silicon film. However, even in the case of using other elements of these groups, or Zn, the following embodiments can be likewise applied thereto. Also, in this case, the amount of adding a small amount of these elements may be adjusted so that the density in the silicon film after being crystallized becomes $2 \times 10^{17}$ to $2 \times 10^{19}$ cm$^{-3}$.

First Embodiment

A first embodiment shows an example of forming a circuit in which a p-channel TFT (hereinafter referred to as "PTFT") using a crystalline silicon film on a glass substrate and an n-channel TFT (hereinafter referred to as "NTFT") are combined so as to be complementary to each other. The structure of this embodiment can be used for a switching element of pixel electrodes and a peripheral driver circuit in an active liquid crystal display unit, an image sensor and other integrated circuits.

Figure 1A:
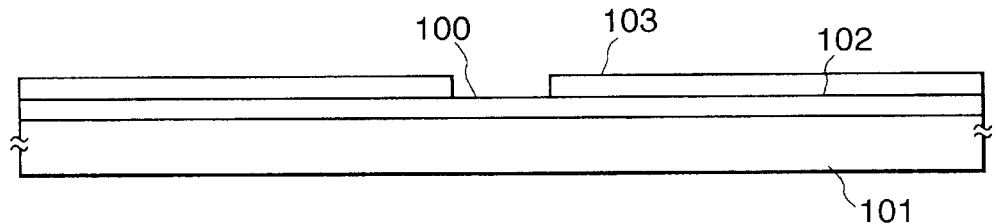
FIGS. 1A to 1D show a process of manufacturing a semiconductor device in accordance with the present invention.

FIGS. 1A to 1D are cross-sectional views showing a process of manufacturing a semiconductor device in according with this embodiment of the invention. In FIG. 1(A), a foundation film 102 made of silicon oxide having a thickness of 2,000 Å is formed on a substrate (Corning 7059) 101 by the sputtering method. Then, a mask 103 formed by a metal mask, a silicon oxide film or the like is formed on the foundation film 102. The foundation film 102 is exposed from the mask 103 in a region 100 in the form of a slit. That is, when the state shown in FIG. 1A is viewed from a top face thereof, the foundation film 102 is exposed in the form of a slit whereas other portions of the film 102 are masked by the mask 103.

After provision of the mask 103, a thin film of In having a thickness of 5 to 200 Å, for example, 20 Å is selectively formed by a vapor deposition method in the region 100. (not shown) In fact, it is difficult to form the In film having a uniform thickness of 20 Å, and the thickness is also difficult to be accurately measured. However, the thickness can be roughly calculated on the basis of the amount of reduction in a vapor deposition source. This process is conducted because a small amount of In which is a Group III element is introduced to crystallize an amorphous silicon film which will be formed on a region where In has been introduced.

Figure 1B:
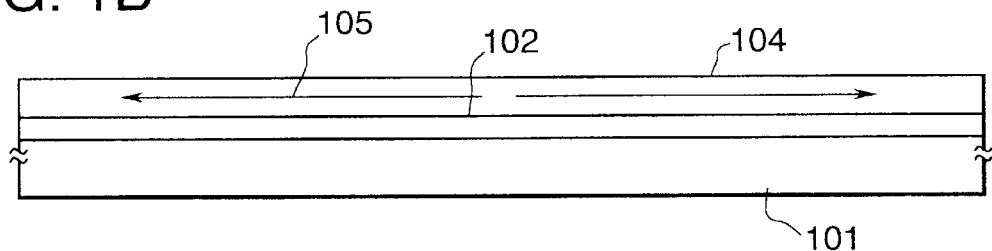

Subsequently, in FIG. 1B, an intrinsic (I-type) amorphous silicon film 104 having a thickness of 500 to 1500 Å, for example, 1,000 Å is formed on the silicon oxide film 102 by a plasma CVD method. Then, the amorphous silicon film 104 is crystallized by annealing at 550° C. for four hours in the hydrogen reducing atmosphere (preferably, the partial pressure of hydrogen is 0.1 to 1 atmospheric pressure) or in the inert atmosphere (air pressure). At this time, in the region 100 on which the thin film of In has been selectively formed, the crystalline silicon 104 is crystallized in a direction perpendicular to the substrate 101. In the regions other than the region 100, as indicated by an arrow 105 in FIG. 1B, a crystal growth is made in a lateral direction (in a direction parallel to the substrate) from the region 100. For example, when In is introduced in the region indicated by reference numeral 100 in FIG. 2, the crystal growth is made one-dimensionally as indicated by arrows 105. The crystal growth is made in the form of a needle or a column.

Then, the crystallization is promoted and further annealed by lamp heating after it has been annealed by heating as described above in order to obtain a more fine crystalline silicon film. This annealing is conducted by an infrared ray of 1.2 µm. The time of annealing is within five minutes. The infrared ray is efficiently absorbed into silicon so as to obtain a great effect in improvement of the film quality of silicon. On the other hand, since the infrared ray is difficult to be absorbed into the glass substrate, energy is selectively given to silicon to provide a significance that the glass substrate is not so heated. As a light used for annealing due to lamp heating, there can be used a tungsten halogen lamp light (wavelength of 0.5 µm to 3.5 µm) or the like. The fine crystalline silicon film can be obtained by annealing due to the lamp heating. Also, annealing can be conducted by using a laser beam instead of the above-mentioned lamp heating. The annealing by lamp heating has such an advantage that crystallization is improved, more particularly defects in the film can be remarkably reduced.

In the case of using a laser light instead of a lamp, a KrF excimer laser (wavelength: 248 nm) or XeCl excimer laser (wavelength: 308 nm) are suitable.

As a result of the above-mentioned process, amorphous silicon film is crystallized to obtain the crystalline silicon film 104. Thereafter, a patterning is done in order to define an active region in which source, drain and channel regions of a TFT are to be formed. In this embodiment, since the crystal growth was found to the extent of about 40 μm or more in the direction parallel to the substrate, the lengths of the respective active layers (lengths in the source/drain directions) are set to 40 μm. In this case, a distance between the center of the channel and the position at which nickel is introduced is approximately 20 μm, and the density of In in the active layers (in particular, the channel forming region) can be selected by setting this distance.

Figure 1C:
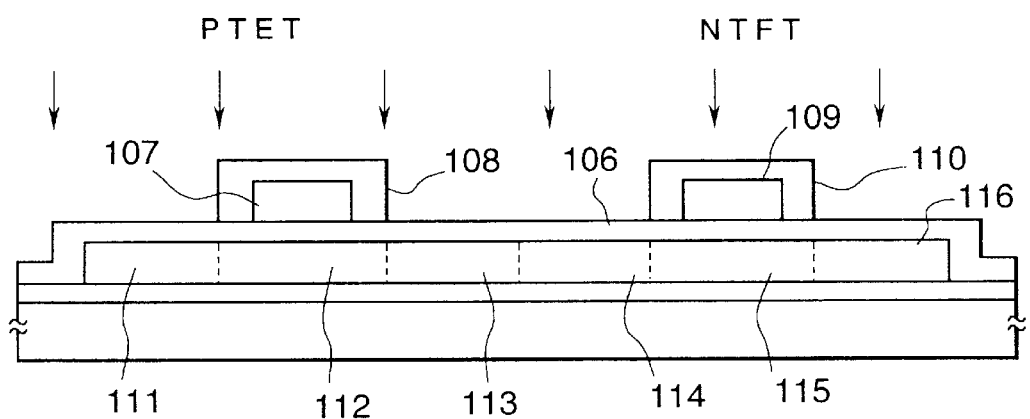

Sequentially, as shown in FIG. 1C, a silicon oxide film 106 having a thickness of 1,000 Å is formed on the crystalline silicon film 104 as a gate insulating film by the sputtering method. In the sputtering, silicon oxide is used as a target, the substrate temperature when sputtering is 200 to 400° C., for example, 350° C., and the sputtering atmosphere is oxygen and argon where the ratio of argon/oxygen is 0 to 0.5, for example, 0.1 or less.

After this process, annealing using the above-mentioned lamp heating is made again. This is to improve the interface characteristics between the gate insulating film 106 comprising the silicon oxide film and the crystalline silicon film 104. Naturally, the crystalline property of the crystalline silicon film 104 is further improved even by this lamp annealing. As is well know it is important to improve the interface characteristics between the gate insulating film and the channel forming region of the insulated gate field effect transistor (in FIG. 1C, reference numerals 112 and 115 denote the crystalline silicon film portions which form the channel forming regions), in more details, to reduce defects and levels in the region as much as possible. Consequently, annealing due to lamp heating performed after forming the gate insulating film 106 can obtain a great effect. Also, annealing may be conducted by irradiation of a laser beam instead of lamp heating.

Thereafter, a film of aluminum (containing silicon of 0.1 to 2%) having a thickness of 6,000 to 8,000 Å, for example, 6,000 Å is formed on the gate insulating film 106 by the sputtering method. Then, as shown in FIG. 1C, gate electrodes 107 and 109 are formed on the gate insulating film 106 by patterning. Furthermore, the surface of the aluminum electrodes is subjected to anodic oxidation to form oxide layers 108 and 110 thereon. The anodic oxidation was conducted in an ethylene glycol solution containing tartaric acid of 1 to 5%. The thicknesses of the oxide layers 108 and 110 obtained were 2,000 Å. Since the oxide layers 108 and 110 become the thicknesses of offset gate regions formed in an ion doping process to be described later, the length of the offset gate region can be determined by the above-mentioned anodic oxidation process. Naturally, the gate electrode may be of material mainly containing silicon, material having silicide of silicon and metal, material mainly containing metal, or a structure having a lamination of silicon and metal.

Subsequently, impurities giving one conductivity type to the active regions (constituting source/drain and channels) are added thereto by an ion doping method (ion-implantation). In this doping process, impurities (phosphorus and boron) are implanted with the gate electrode 107, and the oxide layer 108 in the periphery thereof, the gate electrode 109 and the oxide layer 110 in the periphery thereof as masks. As doping gases, there are used phosphine ($PH_3$) and diborane ($B_2H_6$), and in the former, accelerating voltage is 60 to 90 kV, for example, 80 kV, whereas in the latter, it is 40 to 80 kV, for example, 65 kV. The dose is $1\times10^{15}$ to $8\times10^{15}$ cm$^{-2}$, for example, phosphorus is $2\times10^{15}$ cm$^{-2}$ whereas boron is $5\times10^{15}$. At the time of doping, one region is covered with a photo resist so as to selectively dope the respective elements. As a result, n-type impurity regions 114 and 116 and p-type impurity regions 111 and 113 are formed, respectively, thereby forming a region of a p-channel TFT (PTFT) and a region of an n-channel TFT (NTFT), respectively.

Thereafter, annealing is conducted by irradiation of a laser beam. As the laser beam, there was used a KrF excimer laser (wavelength of 248 nm and pulse width of 20 nsec), however, different kind of lasers may be used. The condition of irradiating the laser beam is that the energy density is 200 to 400 mJ/cm$^2$, for example, 250 mJ/cm$^2$, and 2 to 10 shots, for example, two shots are irradiated per place. It is useful to heat the substrate at about 200 to 450° C. when irradiating the laser beam. In the laser annealing process, since indium has been diffused in the region which has been crystallized in advance, recrystallization readily progresses by irradiation of the laser beams so that the impurity regions 111 and 113 which have been doped with the impurities giving the p-type as well as the impurity regions 114 and 116 which have been doped with the impurities giving the n-type can be readily activated.

As a method of annealing the source/drain regions, the annealing method using the above-mentioned lamp heating is effective. Since the lamp heating (for example, using an infrared ray of 1.2 μm) selectively heats silicon as mentioned above, it is effective in the process of this embodiment where it is desired that the glass substrate is possibly prevented from being heated.

Next, a silicon oxide film 118 having a thickness of 6,000 Å is formed as an interlayer insulator by the plasma CVD method, and then contact holes are formed in the silicon oxide film 118 thereby to form electrode/wiring 117, 120 and 119 with a conductive material, for example, by a multi-layer film made of titanium nitride and aluminum. Finally, annealing is conducted at 350° C. for 30 minutes in the hydrogen atmosphere of 1 atm, thereby to complete a semiconductor circuit including complementary TFTs (FIG. 1D).

The above-mentioned circuit is constituted by a CMOS structure having a complementary PTFT and NTFT pair. Optionally, two TFTs are simultaneously manufactured in the above-mentioned process, and are then cut at the center thereof to simultaneously produce two TFTs independent of each other.

Figure 1D:
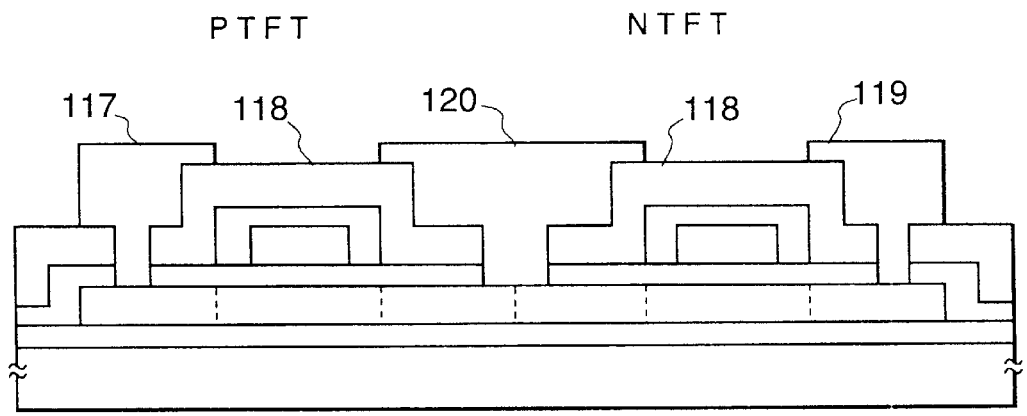
Figure 2:
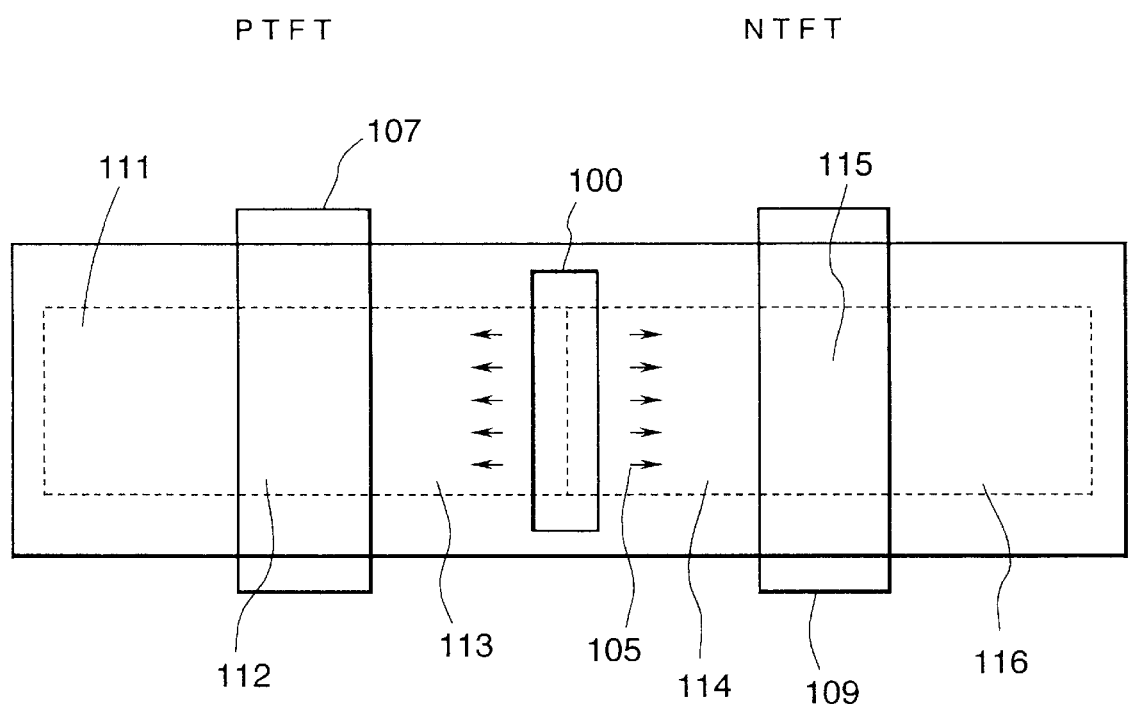
FIG. 2 shows an outline of the semiconductor device according to the invention.

FIG. 2 shows an outline of the semiconductor device of FIG. 1D viewed from a top face thereof. Reference numerals in FIG. 2 correspond to those in FIGS. 1A to 1D. As shown in FIG. 2, the direction of crystallization, that is, the direction of the crystal growth is indicated by the arrows 105. This direction indicates the direction of the outlines of the source/drain regions (the direction of a line linking between the source region and the drain region), and in this structure, when the TFT is operated, the carriers move along the crystal which grew in the form of a needle or a column between the source and the drain. That is, the carriers move along the outline of the crystal grain boundaries of the crystals in the form of a needle or column. Therefore, a resistance received by the carriers when moving can be reduced thereby being capable of obtain TFT having a high mobility.

In this embodiment, as a method of introducing In, a thin film (since it is extremely thin, it is difficult to observe it as a film) is selectively formed on the foundation film 102 under the amorphous silicon film 104, and a method of conducting a crystal growth from that portion is applied. Otherwise, after the amorphous silicon film 104 is formed, the In thin film may be selectively formed. That is, the crystal growth may be made from the upper face of the amorphous silicon film, or from the lower face thereof. As a method of introducing In, the plasma processing, the In ion implantation, or a method of adding a small amount of In when forming a silicon film to be crystallized may be employed.

Second Embodiment

A second embodiment shows an example that, in an active liquid crystal display device, n-channel TFTs are provided in respective pixels as switching elements. Hereinafter, one pixel will be described, however, in fact, a large amount of pixels (in general, several hundred thousands) are formed in the same structure. Of course, the p-channel type other than the n-channel type may be used. Also, the n-channel TFT may be provided not in the pixel portion of the liquid crystal display device but in the peripheral circuit portion. Furthermore, the n-channel TFT may be used for an image sensor or other integrated circuits. That is, if it is used together with a thin film transistor, its use is particularly not limited.

Further, in this embodiment, In is used as a small amount of element for crystallization, and the silicon film which has been crystallized comes into the p⁻-type, thereby to control the characteristics of a n-channel TFT formed. If Sb is used instead of In, then the channel forming region can come into the n⁻-type. Further, its electrical conductivity can be determined in accordance with the amount of introducing a small amount of element, a distance from a position where the element is introduced, and a crystallization condition (the degree of diffusion is changed).

An outline of a process of manufacturing the semiconductor device in accordance with the invention is shown in FIGS. 3A to 3D. In this embodiment, as a substrate 201, a glass substrate (thickness of 1.1 mm, 300×400 mm) is used. First, a foundation film 202 (silicon oxide) having a thickness of 2,000 Å is formed on the substrate 201 by the sputtering method. Thereafter, in order to selectively introduce In, a mask 203 is formed by a metal mask, a silicon oxide film, a photo resist or the like. Then, an In thin film is formed by the vapor deposition method. The In film has a thickness of 5 to 200 Å, for example, 20 Å. In such a way, a small amount of In is selectively introduced into a region 204 for crystallizing the silicon film.

Figure 3A:
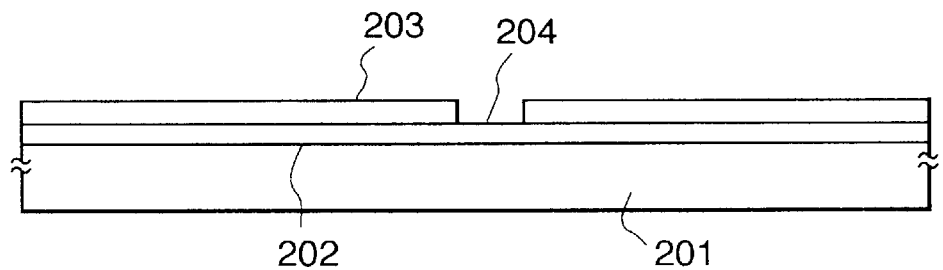
FIGS. 3A to 3D show a process of manufacturing a semiconductor device according to the invention.
Figure 3B:
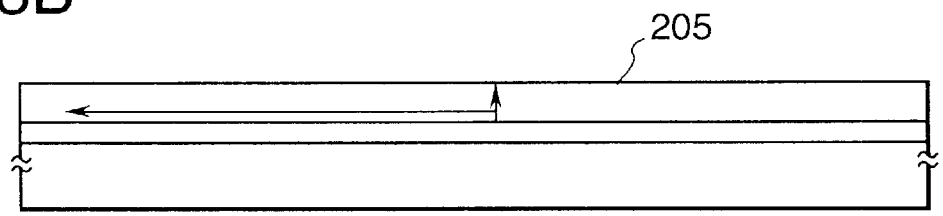
Figure 3C:
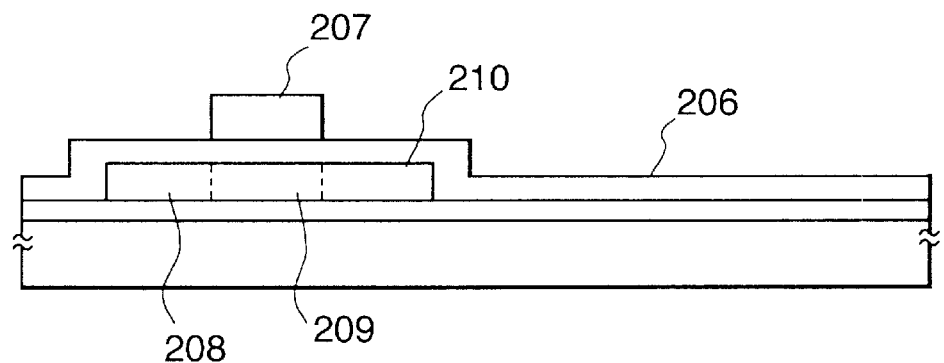

Subsequently, as shown in FIG. 3B, an amorphous silicon film 205 having a thickness of 1,000 Å is formed by the LPCVD method or the plasma CVD method, and after it is subjected to dehydrogenation at 400° C. for one hour, the amorphous silicon film 205 is crystallized by heat annealing. This annealing process is conducted at 550° C. for four hours in the hydrogen reduced atmosphere (preferably, the partial pressure of hydrogen is 0.1 to 1 atmospheric pressure). The heat annealing process may be conducted in the inert atmosphere such as nitrogen or the like.

In the annealing process, since the In film is formed in a part (the region 204) of regions under the amorphous silicon film 205, crystallization starts from this region. The crystallization proceeds vertically to the substrate in the region 204 while it proceeds laterally to the substrate in the other portion of the silicon film 204 as indicated by arrows in FIG. 3B. Thereafter, annealing is conducted by lamp heating likewise as in the first embodiment, thereby improving the crystalline property of the silicon film (densifying).

In such a way, the semiconductor film 205 made of crystalline silicon can be obtained. Sequentially, the above-mentioned semiconductor film 205 is patterned to form a semiconductor region (the active layer of TFT) in the form of an island. At this time, a distance between a portion where a channel forming region 209 is formed and the region 204 where In is introduced is properly set to determine the concentration of In in the channel forming region 209. That is, if the distance is made long, then the concentration of In in the channel forming region 209 can be reduced, whereas if the distance is made short, then the density of In in the channel forming region can be heightened. Naturally, in this case, it must be a region where the silicon film 205 is crystallized.

Further a gate insulating film 206 (thickness of 700 to 1,200 Å, typically 1,000 Å) made of silicon oxide is formed by the plasma CVD method in the oxygen atmosphere with a raw material of tetraethoxy silane (TEOS). The substrate temperature is 400° C., preferably 200 to 350° C., in order to prevent the contraction or warp of the glass substrate. Thereafter, likewise as in the first embodiment, the lamp heating conducted by the irradiation of infrared ray is made for 1 to 5 minutes, thereby to improve the interface characteristics between the semiconductor film 205 and the gate insulating film 206.

Next, a film mainly containing silicon is formed by a known CVD method, and is then patterned thereby to form a gate electrode 207. Thereafter, it is doped with phosphorus as n-type impurities through ion implantation, thereby to form a source region 208, the channel forming region 209 and a drain region 210 in the self-aligning manner with respect to the gate electrode. Then, the KrF laser beam is irradiated to improve the crystalline property of the silicon film which has been deteriorated by the ion implantation. The energy density of the laser beam is 250 to 300 mJ/cm². The sheet resistance of the source/drain of the TFT is 300 to 800 Ω/cm². Similarly, in the process, the lamp heating of the infrared ray can be used instead of using the laser beam used.

Then, an interlayer insulator 211 is formed by silicon oxide, and then a pixel electrode 212 is formed on the interlayer insulator 211 by an ITO. Then, contact holes are formed in the interlayer insulator 211 so that chromium/aluminum multi-layer films are formed in source/drain regions to form electrodes 213 and 214, and one electrode 213 is also connected to the ITO 212. Finally, annealing is made at 200 to 300° C. for two hours in the hydrogen atmosphere, thereby to complete hydrogenation of silicon. In such a way, a TFT is completed. Many TFTs are simultaneously formed in this process in other pixel regions.

Since, in the TFT prepared in this embodiment, a crystalline silicon film whose crystal grew in a direction in which carriers flow is used as active layers constituting a source region, a channel forming region and a drain region, the carriers do not cross the crystal grain boundaries, that is, the carriers move in a direction parallel with the crystal grain boundaries, thereby obtaining the TFT having a high mobility of the carriers.

Figure 5A:
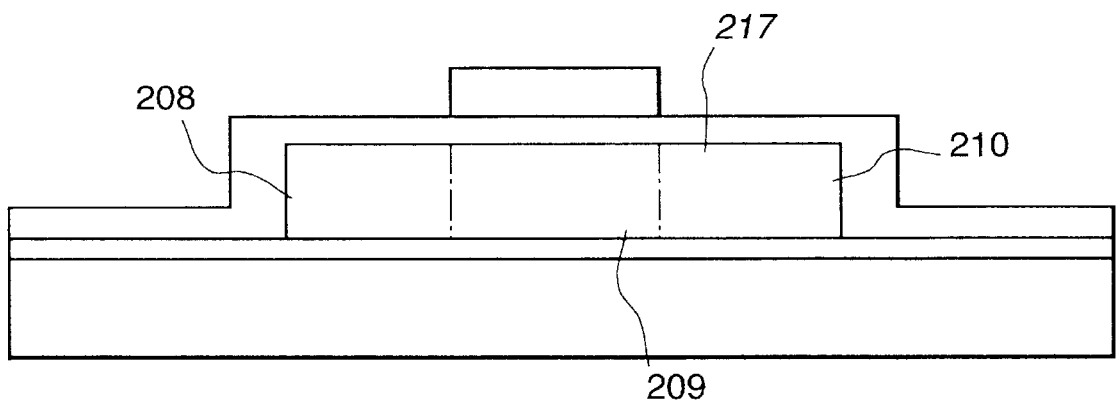
FIG. 5A shows a schematic cross-sectional view of a thin film type insulated gate field effect transistor of the present invention.
Figure 5B:
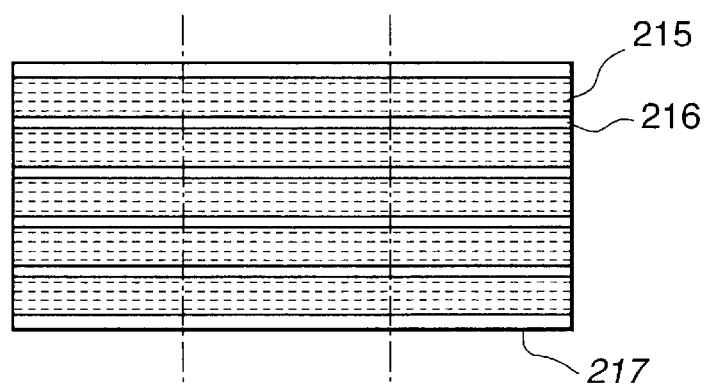
FIGS. 5B and 5C show a relation between a crystal growth direction and a source-drain direction in accordance with the embodiments of the invention.

FIGS. 5A and 5B illustrate this configuration. Namely, FIG. 5A is a schematic cross-sectional diagram of a TFT and FIG. 5B is a schematic plane view of the semiconductor island 217 having source, drain and channel regions therein. In particular, FIG. 5B illustrates the relation between the crystal growth direction and the source-drain direction along which a channel current flows. The reference numeral 215 shows each silicon crystals extending laterally in one direction. The reference numeral 216 shows grain boundaries between crystals. As can been seen, the source, drain and channel regions are so arranged that the source-drain direction is substantially in conformity with the direction in which the silicon crystals uniformly extends. Accordingly, the grain boundaries 216 do not have an adverse effect on the current passing through the channel region.

Third Embodiment

Figure 5C:
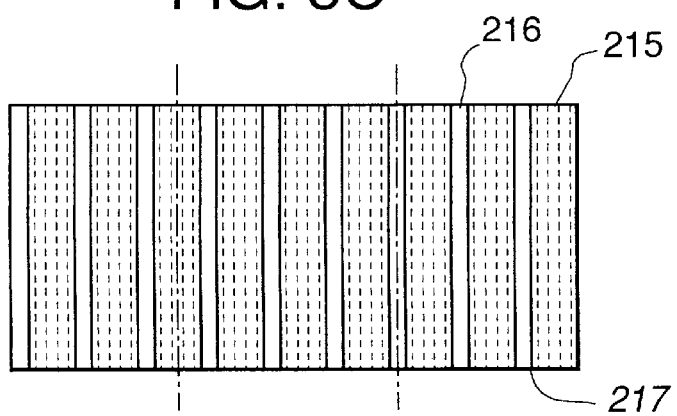

A third embodiment shows an example in which, in the TFT of the second embodiment, source and drain are disposed in a direction perpendicular to the direction of the crystal growth. That is, this is an example in which the direction of the carrier movement is perpendicular to the direction of the crystal growth so that the carriers move so as to be transverse to the grain boundaries of the crystals shaped in a needle or column. FIG. 5C shows a schematic diagram illustrating this condition. Namely, FIG. 5C shows a plane view of the semiconductor island 217 having source, drain and channel regions therein. The direction between source and drain regions is arranged in such a manner that a number of silicon crystals extends in a direction perpendicular to the source-drain direction. The reference numeral 216 designates the grain boundaries. It should be noted that FIGS. 5B and 5C are just for illustrating the relation between the crystal growth direction and the source-drain direction and does not intend to show the actual size or shape of the crystals.

With such a construction, a resistance between a source and a drain can be made high. This is because the carriers must move so as to be transverse to the grain boundaries of the crystals which grew in the form of a needle or column. In order to realize the structure of the invention, in the structure shown in the second embodiment, it is required to consider simply to which direction the TFT should be set.

By using this embodiment, it is possible to manufacture active matrix type liquid crystal devices having pixel TFTs with a lower leak current. That is, in a LCD device, the TFTs prepared in a display portion for switching each pixel need not to have a so high mobility but it is necessary to minimize a leak current, i.e. the current when the TFT is in its off state. For this reason, the direction of the source and drain regions are so designed in such a manner that the current crosses grain boundaries formed within the channel region of the TFT. Therefore, unlike previous embodiments, it is so designed that the direction in which the crystallization proceeds is perpendicular to the current flow direction in the TFT. On the other hand, it is useful to use the TFT of the previous embodiments for forming the peripheral circuit of the display device because it needs TFTs having a high mobility.

Fourth Embodiment

The subject matter of a fourth embodiment is that, in the structure shown in the second embodiment 2, a direction in which a TFT is provided (in this embodiment, the direction is defined by a line linking between the source and drain regions, that is, the direction of the TFT is determined by a direction in which the carriers flow) is set by the direction of a crystal growth with respect to the substrate surface of the crystalline silicon film and an intended angle, thereby selecting the characteristics of the TFT.

As mentioned above, in the case where the carriers are moved in the direction of the crystal growth, since the carriers move along the grain boundaries of crystals, its mobility can be improved. On the other hand, in the case where the carriers are moved in a direction perpendicular to the direction of the crystal growth, since the carriers must go across a large number of grain boundaries, the mobility of the carriers is deteriorated.

Therefore, the mobility of the carriers can be controlled by selecting between these two directions, that is, by setting an angle defined between the direction of the crystal growth and the direction of moving the carriers within a range of 0 to 90°. In other words, the resistance between the source region and the drain region can be controlled by setting the angle between the direction of the crystal growth and the direction of moving the carriers. Naturally, this structure can be applied to that of the first embodiment. In this case, the slit-shaped region 100 in which a small amount of In is added as shown in FIG. 2 rotates in a range from 0 to 90°, and an angle defined between the direction of the crystal growth indicated by the arrows 105 and a line linking the source and drain regions is selected within a range of from 0 to 90°. Then, as this angle approaches 0°, the mobility is made large, thereby providing a structure capable of reducing the electric resistance between the source and the drain. When the angle is close to 90°, the mobility is small, and a resistance between the source and drain, that is, the resistance of the channel forming region is large.

Fifth Embodiment

A fifth embodiment shows an example in which, in the process of manufacturing the semiconductor device in accordance with the second embodiment shown in FIGS. 3A to 3D, a thin film of In is formed on the entire upper surface of the foundation film 202 so that the crystal growth develops on the entire upper surface of the silicon film in the direction perpendicular to the substrate. The TFT is manufactured in such a manner that the thin film is formed on the entire upper surface of the foundation film 202 without provision of the mask 203, and thereafter the amorphous silicon film 205 is formed as described in the second embodiment before the crystallizing process.

Figure 3D:
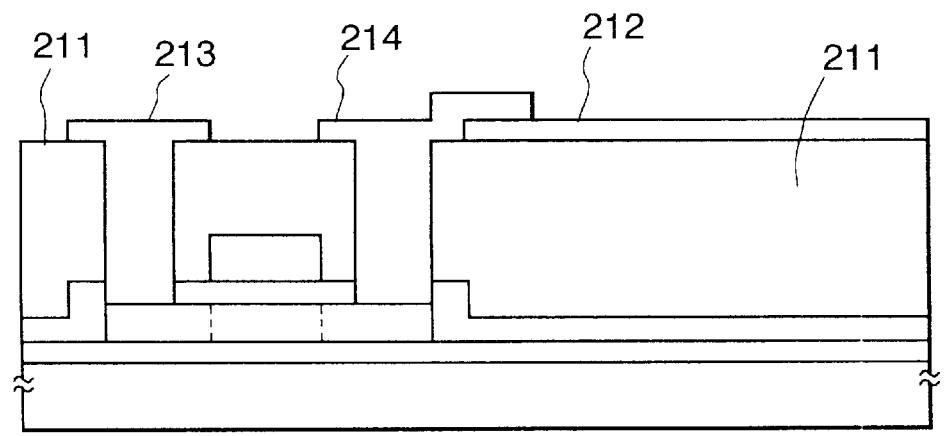
Figure 4:
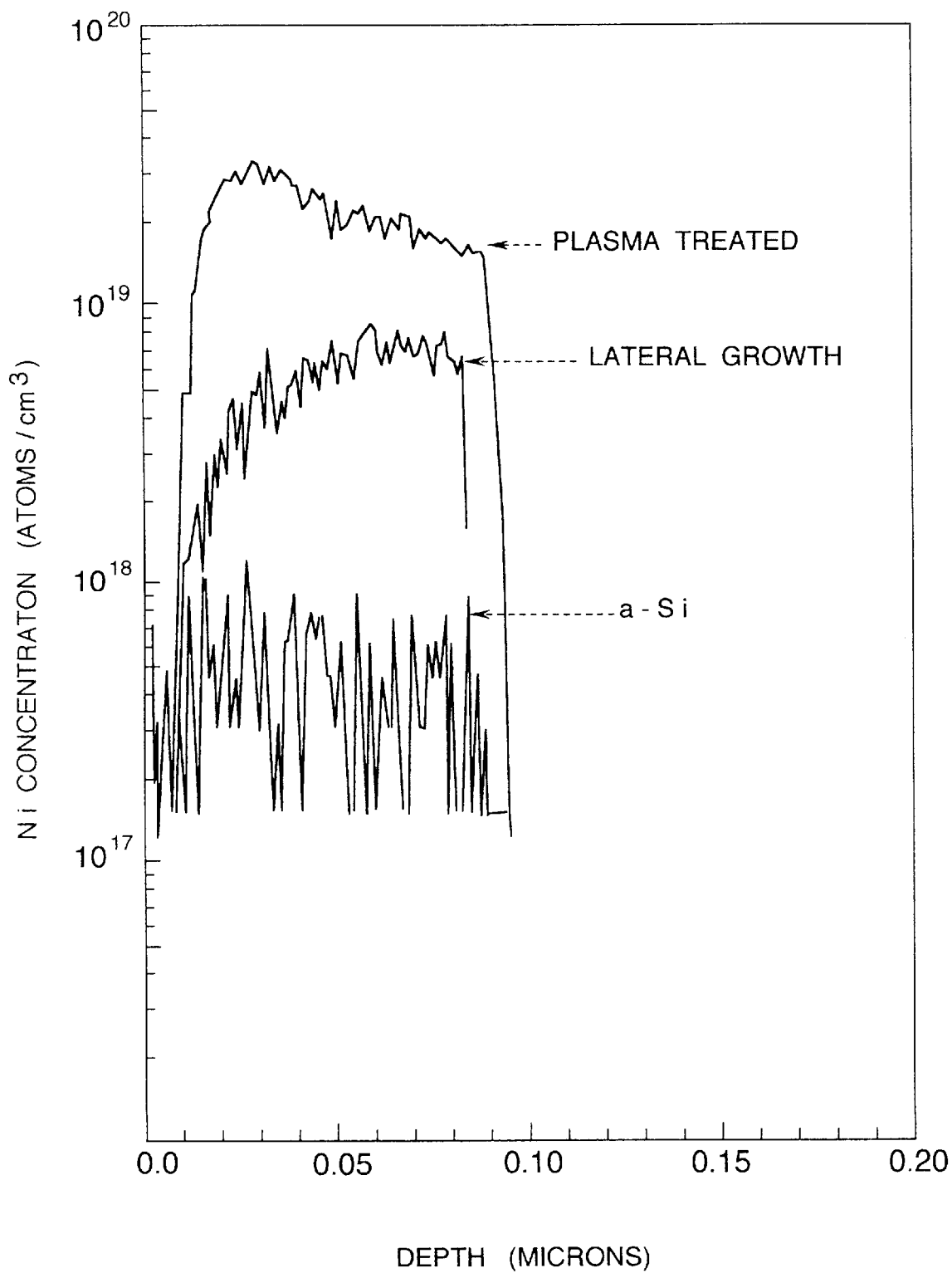
FIG. 4 shows the density of a metal element in a crystalline silicon film.

A cross-sectional view of the outline of the TFT in accordance with this embodiment is not different from that shown in FIG. 3D, however, in the active layers where the source and drain regions 208 and 210 and the channel forming region 209 are formed, the direction of the crystal growth in the form of a needle or column is perpendicular to the substrate 201. For that reason, the carriers moving between the source region (208 or 210) and the drain region (210 or 208) move so as to be transverse to the grain boundaries of the crystals shaped in a needle or column. Accordingly, the resultant TFT has a slightly high resistance between the source and drain. Although such a TFT has a mobility of 100 $cm^2$/Vs or less, an OFF-state current thereof is small so that it is of the type optimum to a TFT for pixels of a liquid crystal display unit for holding charges.

However, since it is difficult for the TFT of this embodiment to control the density of In in the active layer, there rise problems on a yield or reliability. These problems can be eliminated by using a method that can control the amount of introducing In (for example, the ion implantation method).

Sixth Embodiment

A sixth embodiment shows an example in which silicon ions other than a Group III or group V element which is a small amount of element used for crystallizing the silicon film by heating is injected to further promote crystallization. A process of manufacturing the semiconductor device in accordance with this embodiment will be described with reference to FIG. 1. As far as description is not given in particular, the manufacturing condition or the thickness of the film in the respective manufacturing processes are the same as those described in the first embodiment.

First, a foundation film (silicon oxide film) is formed on a glass substrate 101, and a mask 103 is also formed on the foundation film so as to selectively form a thin film of In which is a catalytic metal for crystallization in an exposed region 100. Thereafter, the mask 103 is removed, and a non-single crystalline silicon film, in this case, an amorphous silicon film 104 is formed by the plasma CVD method. Subsequently, silicon which is a group IV element is injected into the entire upper surface of the amorphous silicon film 104 by the ion implantation. At this time, a projection range is set to the substrate side in the vicinity of the interface between the silicon film 104 and the foundation film 102. The accelerating voltage of the ion implantation is 60 kV, and the dose amount is $2 \times 10^{15}$ cm$^{-2}$. As a result, the vicinity of the interface between the substrate (including the foundation film) and the amorphous silicon film 104 is centrally thoroughly changed into amorphous material so that existence to be changed into a crystallization nucleus can be eliminated as much as possible.

The Si ion is used because the Si ion is an impurity which is electrically neutral to silicon. The dose amount of the Si ion may be $5 \times 10^{14}$ to $5 \times 10^{16}$ ion cm$^{-2}$.

Thereafter, the amorphous silicon film 104 is crystallized by heating at 550° C. for four hours. At this time, crystal growth develops from the region 100 in a direction parallel to the substrate as indicated by the arrow 105. The crystal growth is made in the form of a needle or a column. When the crystal grows, since a crystal component (there exists a crystal component to a certain degree even in the amorphous silicon film) which becomes a nucleus of the crystal growth mostly existing on the interface between the substrate and the amorphous silicon film is removed by injecting the silicon ions as described above, the crystal growth developing from the region 100 in the direction parallel to the substrate is not obstructed by the crystal growth developing from the interface between the silicon film 104 and the foundation film 102, thereby being capable of performing the crystal growth with an excellent orientation, that is, of performing the crystal growth whose growing directions are uniformly aligned.

In the latter process, a PTFT and an NTFT are formed as described in the first embodiment to complete a complementary TFT circuit. As in this embodiment, in the crystal silicon film with an excellent orientation, when the TFT is formed so that the direction of the crystal growth almost coincides with that of the carrier movement, the carriers move along the crystal grain boundaries, resulting in a structure where the carriers are hardly affected by the crystal grain boundaries when they move. That is, a high-speed operation can be performed.

In this embodiment, there can be obtained the TFT with an improved crystalline property and a high mobility. It is considered that this is because, in the crystal growth from the region into which In of a Group III element is introduced in the direction parallel to the substrate, since the crystal component which prevents the crystal growth and promotes the crystal growth in the direction perpendicular to the substrate has been thoroughly removed in advance, the crystal growth in the direction parallel to the substrate develops in priority. It is considered particularly effective that the vicinity of the interface between the substrate and the silicon film in which a crystal nucleus, which allows the crystal to grow in the form of a column in the direction perpendicular to the substrate, exists has been thoroughly changed into amorphous material.

Seventh Embodiment

A seventh embodiment shows an example in which, in the active liquid crystal display device, a peripheral driver circuit is constituted by TFTs which are crystallized by adding a small amount of a Group III or group V element in the manufacturing process shown in the first and second embodiments, and TFTs provided in a pixel portion are constituted by those using known amorphous silicon.

As is generally known, in the active liquid crystal display unit, the TFT constituting the peripheral driver circuit portion has a high mobility (100 cm$^2$/Vs or more) and requires a TFT which allows a large amount of ON-state current to flow. However, the TFT provided in the pixel portion is required to have a relatively small mobility (about 10 cm$^2$/Vs) in order to prevent malfunction caused by an OFF-state current and a light irradiation for holding charges.

The peripheral circuit portion is constituted by the TFT described in the first or second embodiment and the pixel portion is formed by the TFT (a-Si TFT) using known amorphous silicon film, with the result that the demand is satisfied to some degree. However, there remains a problem in that the TFT using the amorphous silicon film has its mobility of 1 cm$^2$/Vs or less.

Eighth Embodiment

An eighth embodiment further develops the seventh embodiment, and shows an example in which TFTs constituting the peripheral circuit portion are constituted by a semiconductor layer having a high mobility of 100 cm$^2$/Vs or more shown in the first and second embodiments, and TFTs constituting a pixel portion are constituted by the TFT shown in the fifth embodiment.

The TFT shown in the fifth embodiment is constituted in such a manner that a crystal grows in a direction perpendicular to the substrate so that the crystal grain boundaries are perpendicular to the flow of carriers, whereby the carriers cross a large number of crystal grain boundaries. The mobility of such a TFT is lowered because the movements of the carriers are obstructed by the crystal grain boundaries. However, since the OFF-state current is reduced, a charge holding ratio can be heightened so as to be suitable for the TFT for pixels.

In this embodiment, if the mobility of the TFT constituting the peripheral circuit portion is to be further heightened, the ion implantation of a neutral element shown in the seventh embodiment may be made in that region.

Ninth Embodiment

A ninth embodiment shows an example in which Sn of a Group IV element is used as a small amount of element for promoting crystallization in the first or second embodiment. C, Ge and Pb other than Sn can be used. In this embodiment, Sn is introduced as a thin film by the vapor deposition, likewise as in the first and second embodiments. The ions of Sn may be injected in an amorphous silicon film so that Sn is directly introduced in the silicon film.

As was described above, according to the present invention, when an amorphous silicon semiconductor film provided on a substrate and having a crystalline property that a crystal grows in a direction parallel to the surface of the substrate is used for a TFT, the flow direction of carriers moving with the TFT coincides with the direction in which the crystal grows, thereby being capable of providing a structure in which the carriers move along (in parallel to) the grain boundaries of crystals which grew in the form of a needle or a column, as a result of which a TFT having a high mobility can be obtained. Further, since the TFT can be formed at a low temperature such as 600° C. or less, an inexpensive glass substrate can be used as a substrate.

Furthermore, the TFT having a required mobility can be separately manufactured. In the concrete, 1) The TFT is manufactured by using a crystalline silicon film whose crystal grew in the direction parallel to the substrate so that the carriers move along the grain boundaries of crystals.

2) The TFT is manufactured by using a crystalline silicon film whose crystal grew in the direction parallel to the substrate so that the carriers cross the grain boundaries of crystals.

3) The TFT is manufactured in a region where a crystal grew in a direction perpendicular to the substrate.

4) An element for crystallization is partially introduced to selectively form a crystalline silicon film which is used to change a specified portion of the TFT into a high-mobility TFT.

In particular, since a crystal silicon film in a region apart from a region where an element for crystallization has been introduced has a one-dimensional orientation, a TFT having a high mobility can be obtained using that region.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing a semiconductor device comprising the steps of:
    forming a non-single crystalline semiconductor layer comprising silicon on a surface;
    introducing an element selected from the group consisting of B, Al, Ga, In, Tl, Sc, Y, Lanthanide series elements, C, Ge, Sn, Pb, Ti, Zr, Hf, N, P, As, Sb, Bi, V, Nb, Zn and Ta into at least a portion of said semiconductor layer;
    heat crystallizing said semiconductor layer after said introducing; and
    forming an active region of said semiconductor device within a portion of said semiconductor layer after said crystallizing;
    wherein said portion of the semiconductor layer includes at least one grain boundary extending in a direction substantially parallel with a direction in which an electric current of said device is to be passed.

2. The method of claim 1 wherein said crystals are in the form of a column or needle.

3. The method of claim 1 wherein a concentration of said element in said channel semiconductor layer is in the range of $2 \times 10^{17}$ to $2 \times 10^{19}$ atoms/cm$^3$.

4. The method of claim 1 wherein said semiconductor device is a TFT forming a driver for a peripheral circuit of an active type liquid crystal display.

5. A method for manufacturing a semiconductor device comprising the steps of:
    forming a non-single crystalline semiconductor layer comprising silicon on a surface;
    introducing an element selected from the group consisting of B, Al, Ga, In, Tl, Sc, Y, Lanthanide series elements, C, Ge, Sn, Pb, Ti, Zr, Hf, N, P, As, Sb, Bi, V, Nb, Zn and Ta into at least a portion of said semiconductor layer;
    heat crystallizing said semiconductor layer after said introducing;
    recrystallizing said semiconductor layer by using light after said heat crystallizing; and
    forming an active region of said semiconductor device within a portion of said semiconductor layer after said recrystallizing;
    wherein said portion of the semiconductor layer includes at least one grain boundary extending in a direction substantially parallel with a direction in which an electric current of said device is to be passed.

6. The method of claim 5 wherein said crystals are in the form of a column or needle.

7. The method of claim 5 wherein a concentration of said material in said channel semiconductor layer is in the range of $2 \times 10^{17}$ to $2 \times 10^{19}$ atoms/cm$^3$.

8. The method of claim 5 wherein said light is emitted from a lamp.

9. The method of claim 5 wherein said light is a laser light.

10. A method for manufacturing at least first and second semiconductor devices comprising the steps of:
    forming a non-single crystalline semiconductor layer comprising silicon on a surface;
    introducing an element selected from the group consisting of B, Al, Ga, In, Tl, Sc, Y, Lanthanide series elements, C, Ge, Sn, Pb, Ti, Zr, Hf, N, P, As, Sb, Bi, V, Nb, Zn and Ta into at least a portion of said semiconductor layer;
    heat crystallizing said semiconductor layer after said introducing; and
    patterning said semiconductor layer into at least first and second active regions after said heat crystallizing;
    wherein said first active region includes at least one grain boundary extending in a direction substantially parallel with a direction in which an electric current of the first semiconductor device is to be passed,
    wherein said second active region includes at least one grain boundary extending in a direction substantially perpendicular to a direction in which an electric current of the second semiconductor device is to be passed.

11. The method of claim 10 wherein said crystals are in the form of a column or needle.

12. The method of claim 10 wherein a concentration of said material in said channel semiconductor layer is in the range of $2 \times 10^{17}$ to $2 \times 10^{19}$ atoms/cm$^3$.

13. The method of claim 10 wherein said first semiconductor device is a TFT forming a driver for a peripheral circuit of an active type liquid crystal display.

14. The method of claim 10 wherein said second semiconductor device is a TFT for pixels of an active type liquid crystal display.

15. The method of claim 10 wherein said second semiconductor layer is crystallized by said heating perpendicularly to said surface in said second active region.

16. A method for manufacturing at least first and second semiconductor devices comprising the steps of:
    forming a non-single crystalline semiconductor layer on a surface;
    introducing an element selected from the group consisting of B, Al, Ga, In, Tl, Sc, Y, Lanthanide series elements, C, Ge, Sn, Pb, Ti, Zr, Hf, N, P, As, Sb, Bi, V, Nb, Zn and Ta into at least a portion of said semiconductor layer;
    heat crystallizing said semiconductor layer after said introducing;
    recrystallizing said semiconductor layer by using light after said heat crystallizing; and then
    patterning said semiconductor layer into at least first and second active regions after said heat crystallizing;
    wherein said first active region includes at least one grain boundary extending in a direction substantially parallel with a direction in which an electric current of the first semiconductor device is to be passed, wherein said second active region includes at least one grain boundary extending in a direction substantially perpendicular to a direction in which an electric current of the second semiconductor device is to be passed.

17. The method of claim 16 wherein said crystals are in the form of a column or needle.

18. The method of claim 16 wherein a concentration of said material in said channel semiconductor layer is in the range of $2 \times 10^{17}$ to $2 \times 10^{19}$ atoms/cm$^3$.

19. The method of claim 16 wherein said light is emitted from a lamp.

20. The method of claim 16 wherein said light is a laser light.

21. The method of claim 16 wherein said semiconductor layer is crystallized by said heating perpendicularly to said surface in said second active region.

* * * * *